United States Patent [19]
Wong et al.

[11] Patent Number: 5,132,633
[45] Date of Patent: Jul. 21, 1992

[54] PLL USING A MULTI-PHASE FREQUENCY CORRECTION CIRCUIT IN PLACE OF A VCO

[75] Inventors: Hee Wong; Tsun-Kit Chin, both of San Jose, Calif.

[73] Assignee: National Semiconductor Corporation, Santa Clara, Calif.

[21] Appl. No.: 703,404

[22] Filed: May 21, 1991

[51] Int. Cl.$^5$ ............................................. H03L 7/099
[52] U.S. Cl. ...................................... 328/14; 328/155; 331/17; 331/25; 331/34
[58] Field of Search .............. 331/17, 25, 34; 328/14, 328/155; 375/120

[56] References Cited

U.S. PATENT DOCUMENTS 5,059,924  10/1991  Jennings .............................. 331/1 A
5,068,628  11/1991  Ghoshal ............................... 331/1 A Primary Examiner—Siegfried H. Grimm
Attorney, Agent, or Firm—Flehr, Hohbach, Test, Albritton & Herbert

[57] ABSTRACT

A phase-locked loop generates a periodic clock signal which matches the frequency of an input signal, such as digital data signals transmitted over an optical fiber. A ring oscillator or other clock generator generates a 2N-phase reference clock signal with a reference frequency $f_0$, where N is a positive, odd integer having a value of at least three. The 2N reference clock phasor signals have evenly distributed phases. A waveform generator generates a 2N-phase control signal having a frequency $|f_M|$ which corresponds to the difference between the input signal's frequency and the reference frequency $f_0$. The value of $f_M$ is greater than zero when the input signal's frequency is higher than $f_0$, and it is less than zero when the input signal's frequency is less than $f_0$. A frequency correction circuit (FCC) generates an output clock signal havng an output frequency which is equal to $f_0+f_M$. The frequency correction circuit modulates each reference phasor signal with a corresponding one of the 2N control phasor signals, and then combines the result modulated reference phasor signals to generate the output clock signal. A phase detector continually compares the output frequency with the input signals's frequency, and adjusts the frequency $f_M$ of the 2N control phasor signals so that the output frequency closely matches the input frequency. Typically, the reference frequency differs from the input frequency by no more than a factor of one in a thousand.

11 Claims, 3 Drawing Sheets

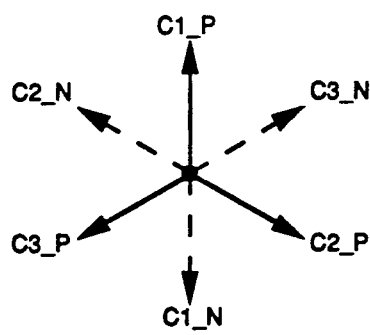
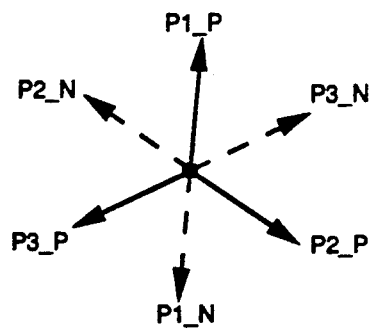
FIGURE 4A  FIGURE 4B
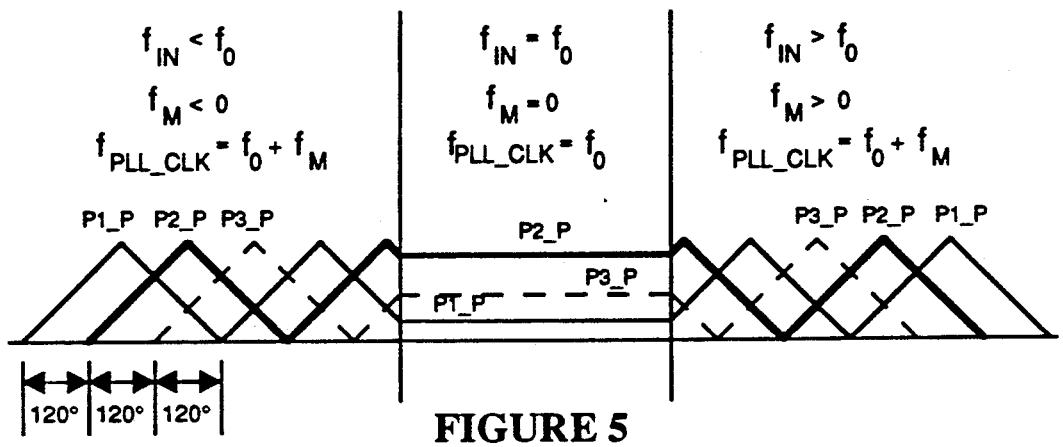
FIGURE 5
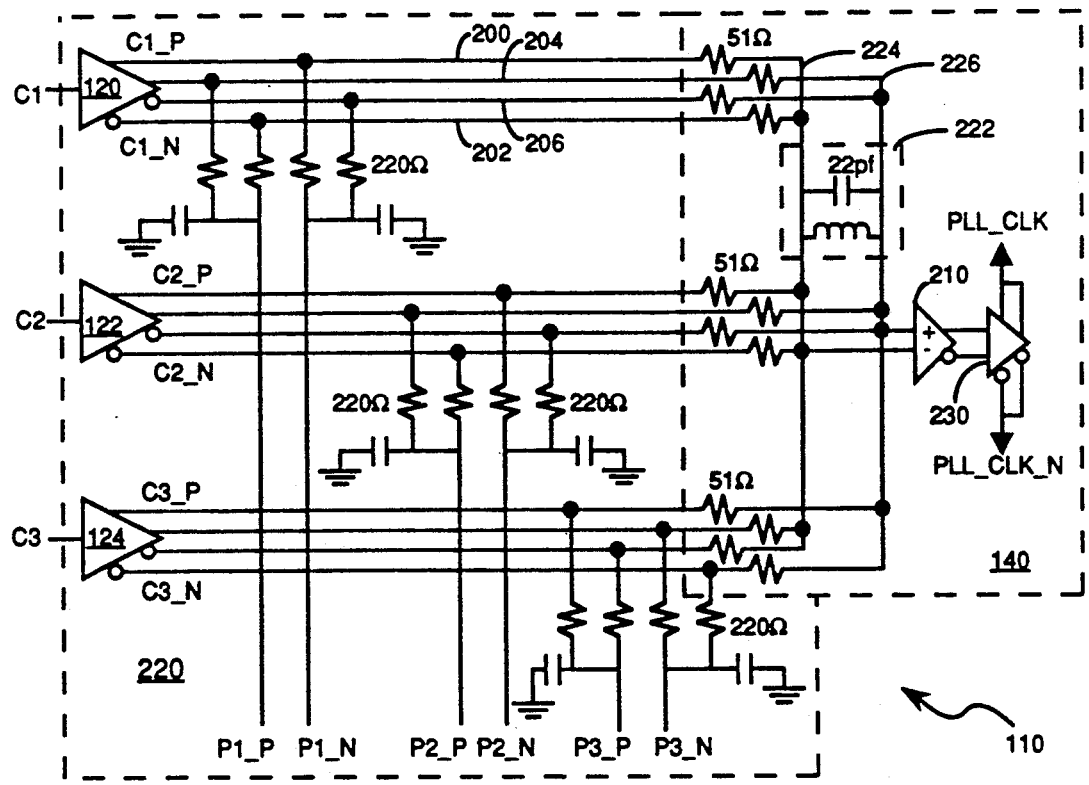
FIGURE 6

PLL USING A MULTI-PHASE FREQUENCY CORRECTION CIRCUIT IN PLACE OF A VCO

The present invention relates generally to phase-locked loop circuits, especially as used in clock and data recovery circuits. The invention is especially suitable for generating clock signals with frequencies above 50 Megahertz (MHz).

BACKGROUND OF THE INVENTION

The following terminology will be used to distinguish between clock signals, the frequencies of clock signals, and the clock period of such clock signals. Clock signals, such as $F_x$, are denoted with a signal name starting with a capital F. The frequency of clock $F_x$ is denoted $f_x$ and the clock period of clock $F_x$ is denoted $T_x$, which is equal to $1/f_x$.

FIG. 1 shows a block diagram of a typical frequency synthesizer 20. The synthesizer 20 consists of a phase detector 22, a loop filter 24, a voltage controlled oscillator (VCO) 26 and two frequency dividers 28 and 30. Components 22 through 28 form a conventional phase-locked loop (PLL) 32. When the synthesizer is in lock, the specified output frequency is $$f_{out} = N * f_{REF} = N * f_{EXT}/M \qquad \text{(Eq. 1)}$$

where M and N are the divisors of the frequency dividers 30 and 28, respectively. M and N are typically integers. The reference frequency, $f_{REF}$, is generated by dividing an external reference frequency, $f_{EXT}$, by M. The specified output frequency, $f_{OUT}$, is then synthesized from clock $F_{REF}$ by means of the phase-locked loop (PLL) 32. The specified output frequency can be adjusted by digitally varying (i.e., programming) the value of N. Therefore, the minimum increment by which $f_{OUT}$ can be changed, i.e., the resolution of the frequency synthesizer 20, is simply the reference frequency, $f_{REF}$.

In applications where the purpose of the phase-locked loop is to generate a clock signal which matches the frequency of the external clock $F_{EXT}$, the two frequency dividers 28 and 30 can be eliminated. A typical application for such a circuit is regenerating the clock associated with a received signal, where the frequency of the received signal can vary within a known frequency range.

Traditional voltage-controlled oscillators (VCOs) used in analog phase-locked loops normally require the conversion of an analog voltage to a capacitance, and then the capacitance is used to control the output frequency of an oscillator. This approach is sensitive to input noise, as well as other common mode interferences such as dc offset and supply voltage variation because the frequency controlling element is a single-ended voltage source and the voltage to frequency conversion gain is usually high and non-linear. Put more simply, traditional VCOs have significant problems when used in very high frequency (e.g., over 50 or 100 MHz) phase-locked loops.

Some PLLs use conventional digital controlled oscillators (DCOs) instead of a VCO. However, DCOs require a local clock frequency many times higher than the PLL's operating frequency in order to achieve acceptable phase resolution. Thus the DCO in a PLL with an operating frequency of 100 MHz may need a local clock with frequency higher than 1 GHz, which cannot be achieved using conventional integrated circuits.

The present invention, together with a signed phase-to-frequency converter (also called a waveform synthesizer), replaces the traditional VCO in a PLL. The FCO of the present invention provides a mechanism that can be used to generate output clock signals matching an input signal's frequency, with the FCO using a local clock that is approximately equal to the operating frequency of the PLL. The present invention is especially suitable for high PLL operating frequencies, above 50 MHz.

SUMMARY OF THE INVENTION

In summary, the present invention is a frequency correction circuit (FCC) suitable for use in high frequency phase-locked loops. The FCC, when used in a phase-locked loop, generates a periodic clock signal which matches the frequency of an input signal, such as digital data signals transmitted over an optical fiber. The purpose of the FCC is to generate an output signal $F_{OUT}$ whose frequency $f_{OUT}$ is equal to $f_0 \pm f_M$, where $f_M$ represents the frequency error between a local clock signal $F_0$ and a PLL input signal $F_{IN}$. The FCC's local clock is taken from a high frequency N-stage ring oscillator which generates N equally phase spaced clock signals having frequency $f_0$, where N is an odd integer that is greater than or equal to three.

A lower frequency waveform synthesizer generates a set of N equally phase spaced, low frequency control signals having frequency $f_M$ that is determined by the phase error between the local clock signal $F_0$ and the input signal $F_{IN}$. The N control signals $F_M$ have a leading/lagging phase relationship determined by the sign of the phase error. Each low frequency control signal is used to modulate one of the high frequency signals, and the resulting signals are summed to generate an output signal $F_{OUT}$ whose freqeuncy $f_{OUT}$ is equal to $f_0 + f_M$ or $f_0 - f_M$, depending on the leading/lagging phase relationship of the control signals.

A phase detector means continually compares the FCC output signal's frequency with the input signal's frequency, and adjusts the frequency $f_M$ of the control phasor signals so that the output frequency closely matches the input frequency.

BRIEF DESCRIPTION OF THE DRAWINGS

Additional objects and features of the invention will be more readily apparent from the following detailed description and appended claims when taken in conjunction with the drawings, in which:

FIG. 4A depicts six high frequency phasors, and FIG. 4B depicts six low frequency control phasors used as control or modulation signals.

FIG. 5 is a timing diagram showing the waveforms of the low frequency control phasors used as control or modulation signals.

FIG. 6 is a circuit diagram of the frequency correction circuit of FIG. 3 with differential operation.

DESCRIPTION OF THE PREFERRED EMBODIMENT

Figure 1:
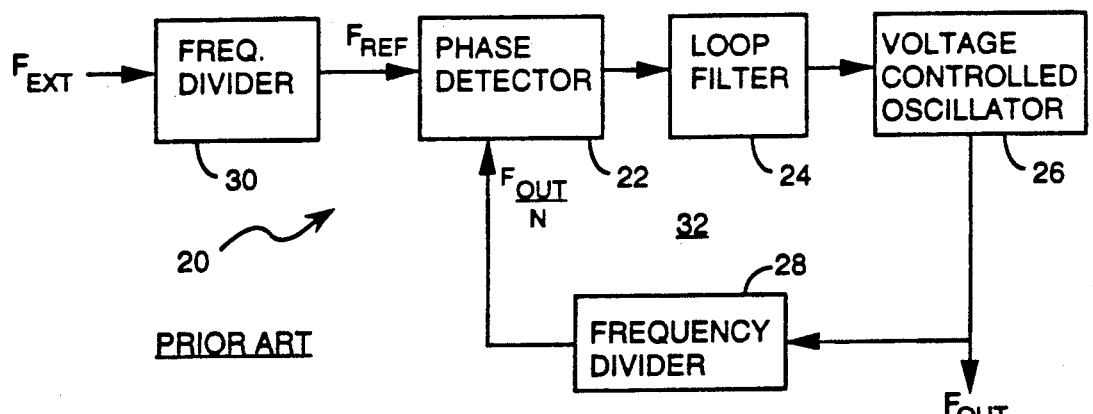
FIG. 1 is a block diagram of a prior art phase-locked loop frequency synthesizer.
Figure 2:
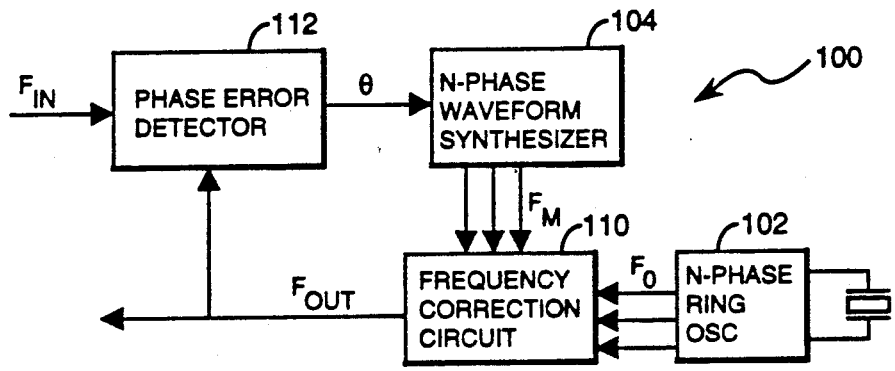
FIG. 2 is a block diagram of a phase-locked loop for very high frequency applications in accordance with the present invention.

Referring to FIG. 2, there is shown a high frequency, phase-locked loop (PLL) 100. The function of the PLL 100, at least in the preferred embodiment, is to generate a periodic clock signal $F_{OUT}$ which matches the frequency of an input signal $F_{IN}$, such as digital data signals transmitted over an optical fiber. Generating such a clock signal is essential for accurately decoding the incoming digital data signals.

The primary components of the PLL are as follows. An N-stage ring oscillator 102, where N is an odd integer that is greater than or equal to three, generates N equally phase spaced high frequency (e.g., above 50 MHz) local clock signals (herein called phasors) C1 to CN having frequency $f_0$. A digital waveform synthesizer 104 generates N equally spaced equally phase spaced low frequency control signals having frequency $f_M$. The N control signals have a leading or lagging phase relationship, which is determined by the sign of the phase error between the local clock and the input signal. In the preferred embodiment, the waveform synthesizer 104 is a signed phase-to-frequency converter that generates stepped triangular waveforms (see timing diagram in FIG. 5). The phase error signal from the PLL's phase detector 112 is used to increase or decrease the frequency of the control signals output by the waveform synthesizer 104. A description of the waveform synthesizer 104 used in the preferred embodiment can be found in U.S. Ser. No. 07/681,095, filed on Apr. 5, 1991, which is hereby incorporated by reference.

A frequency correction circuit (FCC) 110 generates an output signal $F_{OUT}$ whose frequency $f_{OUT}$ is equal to $f_0 + f_M$, where $f_M$ corresponds to the frequency error between the local clock $F_0$ and an input signal $F_{IN}$. Finally, a phase error detector 112 continually compares the phase of the output signal $F_{OUT}$ with the phase of the input signal $F_{IN}$, generating a phase error signal $\theta$ which is used by the waveform synthesizer 104 to adjust the frequency $|f_M|$ of the N control phasor signals, as well as the leading/lagging phase relationship among those control phasor signals, so that the output frequency $f_{OUT}$ of the FCC closely matches a predefined integer multiple of the input frequency $f_{IN}$.

Since the preferred embodiment of the frequency synthesizer 100 is for use in a 125 megabit per second FDDI (fiber distribution data interface) system, the reference frequency of the local clock signals generated by the ring oscillator could be 125 MHz, but it is preferable to use a 250 MHz clock and a divide-by-two circuit to ensure data detection symmetry. In the following description of the preferred embodiment of the FCC circuit 110, the target output frequency is twice the input frequency, and for the sake of simplicity the frequency $f_{IN}$ is treated as being equal to 250 MHz instead of 125 MHz.

Typically, in clock/data recovery applications the reference local clock frequency $f_0$ will differ from the input frequency by no more than a factor of one in a thousand. In other applications, the locking range may be as large as one part in ten. In either context the maximum value of $f_M$ is usually low enough to allow the use of low cost digital waveform synthesizers for generating the control signals P1 to PN. In the preferred embodiment, for FDDI applications, the locking range is very narrow, allowing the use of a waveform synthesizer 104 with a maximum $f_M$ of 162.76 KHz, providing a symmetric locking range of 250 MHz ±162.76 KHz, or ±651 ppm (parts per million).

In the preferred embodiment, N is equal to three, and thus there are three high frequency phasors C1, C2 and C3 generated by the ring oscillator 102, and three low frequency control phasors P1, P2 and P3 generated by the waveform synthesizer 104. It is noted that ring oscillators are well known to those skilled in the art, and that a free running ring oscillator generally must have an odd number of stages. Typically each stage of the ring oscillator is an inverter. Further, the ring oscillators are an inexpensive mechanism for generating high frequency reference clock signals. To compensate for the temperature sensitivity of ring oscillator circuits, any one of a number of well known techniques can be used, such as comparing the clock rate of the ring oscillator with the clock rate of a crystal oscillator and then changing the level of the voltage supply for the ring oscillator so as to lock onto a clock rate that corresponds to the crystal's clock rate.

Figure 3:
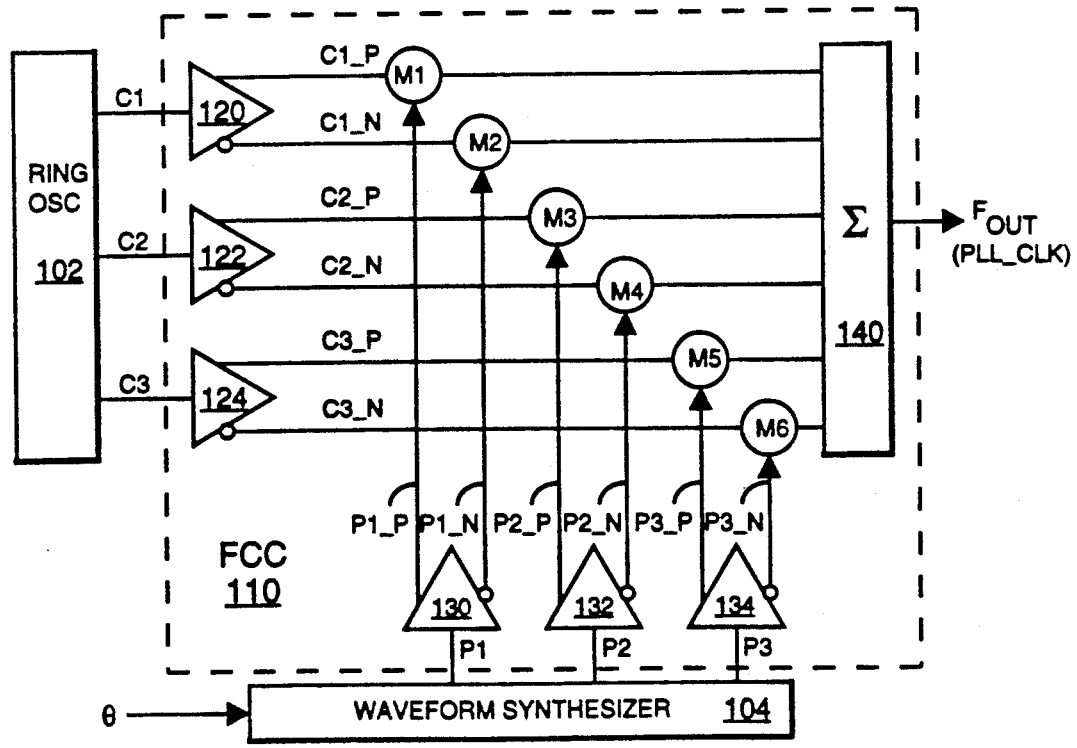
FIG. 3 is a block diagram of a frequency correction circuit.

Referring to FIG. 3, there is shown a conceptual or block diagram of a frequency correction circuit 110, using single-ended operation. Each of the three phasors C1-C3 from the ring oscillator 102 is buffered by an inverting and non-inverting driver 120-124 in FCC110, to generate six equally phase spaced phasors: C1_P, C1_N, C2_P, C2_N, C3_P and C3_N. Similarly, each of the three low frequency phasors P1-P3 from the waveform synthesizer 104 is buffered by an analog inverting and non-inverting amplifier 130-134 to generate six equally phase spaced phasors: P1_P, P1_N, P2_P, P2_N, P3_P and P3_N.

The six high frequency phasors are amplitude modulated, using modulators M1 through M6, by corresponding ones of the low frequency phasors. The resulting modulated signals are then combined by a summing circuit 140 to generate an output signal $F_{OUT}$ whose frequency $f_{OUT}$ is equal to $f_0 + f_M$ or $f_0 - f_M$. A change in frequency or phase shift in the control signals P1-P3 results in an equal change in $F_{OUT}$, allowing the FCC to replace a traditional VCO. The summing circuit 140 includes a bandpass filter (shown as element 222 in FIG. 6) centered at frequency $f_0$ to reject the dc component of the summed clock signal and also to reject any switching glitches caused by the stepped triangular shape of the control waveforms P1-P3. FIG. 4A shows that the high frequency phasors C1_P, C1_N, C2_P, C2_N, C3_P and C3_N are equally phase spaced phasors, each spaced 60 degrees from its neighbor. Similarly, the control phasors P1_P, P1_N, P2_P, P2_N, P3_P and P3_N are equally phase spaced.

The timing diagram of FIG. 5 shows the phase relationships of the phase control signals P1_P, P2_P and P3_P generated by the waveform synthesizer 104, which depends on whether the frequency $f_{IN}$ of the input signal is greater than, equal, or less than the reference frequency $f_0$. When $f_{IN}$ is less than $f_0$, P1_P is made to lead P2_P, and P2_P is made to lead P3_P, as shown at the left side of the timing diagram, which causes $f_{OUT}$ to equal $f_0 - f_M$. When $f_{IN}$ is greater than $f_0$, P1_P is made to lag P2_P, and P2_P is made to lag P3_P, as shown at the right side of the timing diagram, which causes $f_{OUT}$ to equal $f_0 + f_M$. When $f_{IN}$ equals $f_0$, $f_M$ is equal to zero and the control phasors are not time varying, as shown in the middle of the timing diagram, resulting in $f_{OUT}=f_0$.

Figure 7:
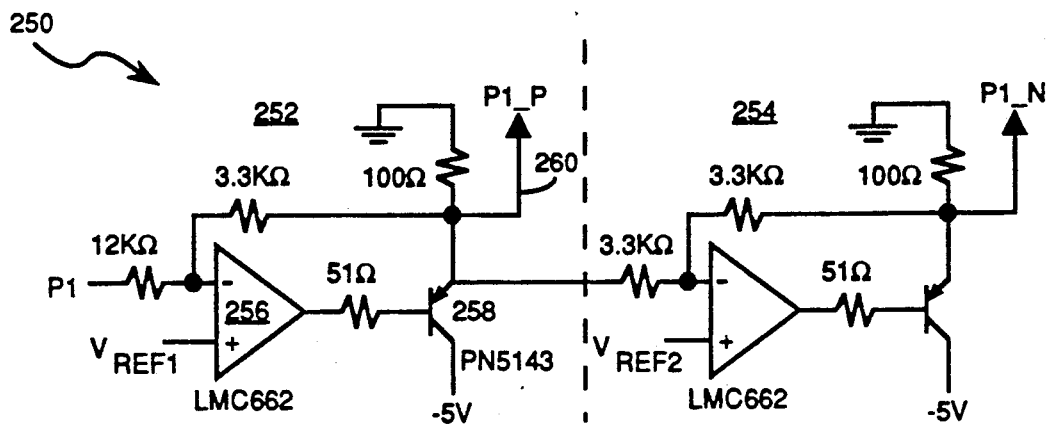
FIG. 7 is a circuit diagram of a circuit for converting one phasor of a three phase control signal into two control signals of opposite phase.

Referring to FIGS. 6 and 7, the circuitry in the FCC110 of the preferred embodiment employs ECL circuit components. For simplicity, the termination resistors of ECL gates are omitted in these figures.

Note that each buffer 120-124 has dual complementary output lines, which for buffer 120 are labelled 200-206. Two of the output lines 204 and 206 are coupled by resistors to the "+" side (line 226) of a differential driver 210 (e.g. the F100114 made by National Semiconductor) and two of the output lines 200 and 202 are coupled to the "−" side (line 224) of the driver 210. The signals on the "+" and "−" sides of driver 210 are simply mirror images of one another. As a result, the differential input signal to the driver 210 is twice as large as it would be if single-ended operation were being used.

All of the high frequency clock lines 200-206, for all phases of that clock signal, are coupled to the control signal circuits that generate the P1, P2 and P3 signals by separate 220 ohm resistors. The open-emitter output stage of buffers 120-124 (e.g., F100113 buffers made by National Semiconductor) together with the 220 ohm emitter resistors form twelve amplitude modulators for modulating the low frequency control signals onto the high frequency reference signals. Each clock signal line is coupled to a differential resistive summing circuit 140, which has a separate 51 ohm driving resistor for each modulated clock line. The summing circuit 140 includes a bandpass filter 222 (equivalent to the LC circuit shown in FIG. 6, but implemented on an integrated circuit using standard active filter techniques) centered at frequency $f_0$ to reject the dc component as well as unwanted harmonics of the summed clock signal. The summed and filtered clock signals on lines 224 and 226, which are mirror images of one another, are amplified by a differential driver 210, and then buffered by a buffer stage 230 that outputs a clock signal PLL_CLK and its complement PLL_CLK_N, each of which is a periodic signal having a frequency of $f_0+f_M$ or $f_0-f_M$.

Considering only lines 204 and 206, it can be seen that the P1_P signal modulates the C1_P signal on line 204, and that the P1_N signal modulates the C1_N signal on line 206. Amplitude modulation is accomplished simply by applying a time varying voltage to the high frequency signals C1_P and C1_N through a 220 ohm resistor.

Referring to FIG. 7, there is shown a circuit diagram of a circuit 250 for converting one phasor P1 of a three phase control signal into two modulation signals P1_P and P1_N. Three copies of circuit 250 are used to convert control signals P1, P2 and P3 into six phasor control signals P1_P, P1_N, P2_P, P2_N, P3_P and P3_N. The circuit 250 has two stages 252 and 254, with the output signal P1_P of the first stage driving the second stage 254. Each stage has an amplifier 256 that drives the base of a PNP transistor 258. The output line 260 of each stage is coupled to the emitter of the corresponding PNP transistor 258.

The first stage 252 is a level shifter and inverting attenuator, converting the 0 to 5 volt range (typical of TTL circuits) of the triangular P1 signal, to the −1 to −2 volt range used in ECL circuits. The second stage 254 is a simple inverting amplifier.

It should be noted that in other embodiments of the present invention, the number of phases could be any value of 2N, where N is a positive odd integer, such as 6 (as in the preferred embodiment), 10, 14 and so on.

ANALYSIS OF OUTPUT FREQUENCY OF THE FCC

A primary advantage of using a 2N phase signal is that the odd number of N phasors with their complementary signals automatically eliminate unwanted harmonics, especially the third harmonic of the control signal, and theoretically generates a single frequency equal to the sum or the difference of $f_0$ and $f_M$, as controlled by the phase relationship among the control signals.

ANALYSIS A: Using Sinusoidal Waveforms

For simplicity, this analysis assumes single-ended operation as shown in FIG. 3. The high frequency and low frequency clock signals are represented by the following formulas:

$w_0$ is the angular frequency of the three-phase reference clock signals.

$w_M$ is the angular frequency of the three-phase control signals.

$C1\_P = K_1 + \cos\{w_0 t\}$ $C2\_P = K_1 + \cos\{w_0 t - 2\pi/3\}$ $C3\_P = K_1 + \cos\{w_0 t - 4\pi/3\}$ $C1\_N = K_1 - \cos\{w_0 t\}$ $C2\_N = K_1 - \cos\{w_0 t - 2\pi/3\}$ $C3\_N = K_1 - \cos\{w_0 t - 4\pi/3\}$ $F_{OUT} = Ka(m1+m2+m3+m4+m5+m6)$, where Ka is the attenuation factor of the summing network, and $m1 = C1\_P * P1\_P$ $m2 = C1\_N * P1\_N$ $m3 = C2\_P * P2\_P$ $m4 = C2\_N * P2\_N$ $m5 = C3\_P * P3\_P$ $m6 = C3\_N * P3\_N$ CASE A1: P1_P leads P2_P, and P2_P leads P3_P $P1\_P = K_2 + K_3 \cos\{w_M t\}$ $P2\_P = K_2 + K_3 \cos\{w_M t - 2\pi/3\}$ $P3\_P = K_2 + K_3 \cos\{w_M t - 4\pi/3\}$ $P1\_N = K_2 - K_3 \cos\{w_M t\}$ $P2\_N = K_2 - K_3 \cos\{w_M t - 2\pi/3\}$ $P3\_N = K_2 - K_3 \cos\{w_M t - 4\pi/3\}$ $m1 + m2$
$= 2K_1 K_2 + 2\cos\{w_0 t\} * K_3 \cos\{w_M t\}$
$= 2K_1 K_2 + K_3 \cos\{w_0 t + w_M t\} + K_3 \cos\{w_0 t - w_M t\}$
$m3 + m4$
$= 2K_1 K_2 + 2\cos\{w_0 t - 2\pi/3\} * K_3 \cos\{w_M t - 2\pi/3\}$
$= 2K_1 K_2 + K_3 \cos\{w_0 t + w_M t - 4\pi/3\} + K_3 \cos\{w_0 t - w_M t\}$ $m5 + m6$ $= 2K_1K_2 + 2\cos\{w_0t - 4\pi/3\} * K_3\cos\{w_Mt - 4\pi/3\}$
$= 2K_1K_2 + K_3\cos\{w_0t + w_Mt - 2\pi/3\} + K_3\cos\{w_0t - w_Mt\}$
Since $\cos\phi + \cos\{\phi - 2\pi/3\} + \cos\{\phi - 4\pi/3\} = 0$ $F_{OUT} = Ka(m1 + m2 + m3 + m4 + m5 + m6)$
$= 6K_1K_2Ka + (3K_3Ka)\cos\{w_0t - w_Mt\}$ CASE A2: P1_P lags P2_P, and P2_P lags P3_P $P1\_P = K_2 + K_3 \cos\{w_Mt\}$ $P2\_P = K_2 + K_3 \cos\{w_Mt + 2\pi/3\}$ $P3\_P = K_2 + K_3 \cos\{w_mt + 4\pi/3\}$ $P1\_N = K_2 - K_3 \cos\{w_Mt\}$ $P2\_N = K_2 - K_3 \cos\{w_Mt + 2\pi/3\}$ $P3\_N = K_2 - K_3 \cos\{w_Mt + 4\pi/3\}$ $m1 + m2$
$= 2K_1K_2 + 2\cos\{w_0t\} * K_3\cos\{w_Mt\}$
$= 2K_1K_2 + K_3\cos\{w_0t + w_Mt\} + K_3\cos\{w_0t - w_Mt\}$
$m3 + m4$
$= 2K_1K_2 + 2\cos\{w_0t - 2\pi/3\} * K_3\cos\{w_Mt + 2\pi/3\}$
$= 2K_1K_2 + K_3\cos\{w_0t + w_Mt\} + K_3\cos\{w_0t - w_Mt - 4\pi/3\}$
$m5 + m6$
$= 2K_1K_2 + 2\cos\{w_0t - 4\pi/3\} * K_3\cos\{w_Mt + 4\pi/3\}$
$= 2K_1K_2 + K_3\cos\{w_0t + w_Mt\} + K_3\cos\{w_0t - w_Mt - 2\pi/3\}$
Since $\cos\phi + \cos\{\phi - 2\pi/3\} + \cos\{\phi - 4\pi/3\} = 0$ $F_{OUT} = Ka(m1 + m2 + m3 + m4 + m5 + m6)$
$= 6K_1K_2Ka + (3K_3Ka)\cos\{w_0t + w_Mt\}$ ANALYSIS B: Using Square Wave Clock and Triangular Control Signals The reference clock phasors are square waves at angular frequency $w_0$, with a duty cycle of 50%, peak amplitude of ±0.5 and dc offset of $K_1$. Using Fourier series, the reference clocks can be approximated by:

$C1\_P = K_1 + 2/\pi\{\cos w_0t - (1/3)\cos 3w_0t + (1/5)\cos 5w_0t - (1/7)\cos 7w_0t \ldots \}$ $C2\_P = K_1 + 2/\pi\{\cos(w_0t - 2\pi/3) - (1/3)\cos(3w_0t - 3*2\pi/3) + (1/5)\cos(5w_0t - 5*2\pi/3) - (1/7)\cos(7w_0t - 7*2\pi/3)\ldots\}$ $= K_1 + 2/\pi\{\cos(w_0t - 2\pi/3) - (1/3)\cos 3w_0t + (1/5)\cos(5w_0t - 4\pi/3) - (1/7)\cos(7w_0t - 2\pi/3)\ldots\}$ $C3\_P = K_1 + 2/\pi\{\cos(w_0t - 4\pi/3) - (1/3)\cos(3w_0t - 3*4\pi/3) + (1/5)\cos(5w_0t - 5*4\pi/3) - (1/7)\cos(7w_0t - 7*4\pi/3)\ldots\}$ $= K_1 + 2/\pi\{\cos(w_0t - 2\pi/3) - (1/3)\cos 3w_0t + (1/5)\cos(5w_0t - 2\pi/3) - (1/7)\cos(7w_0t - 4\pi/3)\ldots\}$ The 3-phase control signals P1_P, etc. are triangular waves at angular frequency $w_M$, with amplitude ±0.5$K_3$ and dc offset of $K_2$. Using Fourier series, the control signals can be approximated by:

$P1\_P = K_2 + 4K_3/\pi^2\{\cos w_Mt + (1/9)\cos 3w_Mt + (1/25)\cos 5w_Mt + (1/49)\cos 7w_Mt \ldots\}$ $P2\_P = K_2 + 4K_3/\pi^2\{\cos(w_Mt \pm 2\pi/3) + (1/9)\cos(3w_Mt \pm 3*2\pi/3) + (1/25)\cos(5w_Mt \pm 5*2\pi/3) + (1/49)\cos(7w_Mt \pm 7*2\pi/3)\ldots\}$ $= K_2 + 4K_3/\pi^2\{\cos(w_Mt \pm 2\pi/3) + (1/9)\cos 3w_Mt + (1/25)\cos(5w_Mt \pm 4\pi/3) + (1/49)\cos(7w_Mt \pm 2\pi/3)\ldots\}$ $P3\_P = K_2 + 4K_3/\pi^2\{\cos(w_Mt \pm 4\pi/3) + (1/9)\cos(3w_Mt \pm 3*4\pi/3) + (1/25)\cos(5w_Mt \pm 5*4\pi/3) + (1/49)\cos(7w_Mt \pm 7*4\pi/3)\ldots\}$ $= K_2 + 4K_3/\pi^2\{\cos(w_Mt \pm 4\pi/3) + (1/9)\cos 3w_Mt + (1/25)\cos(5w_Mt \pm 2\pi/3) + (1/49)\cos(7w_Mt \pm 4\pi/3)\ldots\}$ Since the bandpass filter 222 will eliminate harmonics above $2f_0$, we can assume that the 3-phase reference clock signals are pure sinusoids:

$C1\_P = K_1 + 2/\pi\{\cos w_0t\}$ $C2\_P = K_1 + 2/\pi\{\cos(w_0t - 2\pi/3)\}$ $C3\_P = K_1 + 2/\pi\{\cos(w_0t - 4\pi/3)\}$ Applying the result derived from Analysis A for each sinusoidal component of the triangular 3-phase control signals, the following equation for the output clock $F_{OUT}$ can be derived for cases A1 and A2 of Analysis A:

$F_{OUT} = Ka(m1 + m2 + m3 + m4 + m5 + m6)$
$= DC \text{ component} +$
$\dfrac{24K_3Ka}{\pi^3}\{\cos\{w_0t \pm w_Mt\} +$
$(1/25)\cos\{w_0t \mp 5w_Mt\} +$
$(1/49)\cos\{w_0t \pm 7w_Mt\} + \ldots\}$ The DC component of $F_{OUT}$ is removed by the bandpass filter 222 in the summing circuit 140. As can be seen from the above equation, the third harmonic of $f_M$ present in the control signal phasors (i.e., the $w_0 \pm 3w_M$ component of the P1, P2 and P3 signals) is canceled out when all the modulated signal components are summed, and the next harmonic that is present in the summed signal (i.e., the $w_0 \pm 5w_M$ component) has only 4% of the amplitude of the main $F_{OUT}$ signal component. Thus the use of an odd number of clock and triangular control phasors and their complements (i.e., 2N phasors where N is an odd integer) in the FCC generates a high frequency PLL clock signal with acceptable granularity.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A method of generating a clock signal, comprising:
   receiving an input signal having an associated input frequency;
   generating a 2N-phase reference clock signal with a reference frequency $f_0$, where N is a positive, odd integer having a value of at least three; said reference clock signal comprising 2N reference phasor signals;
   generating a 2N-phase control signal having a frequency $|f_M|$, where $f_M$ corresponds to the difference between a predefined integer multiple of said input frequency and said reference frequency; said control signal comprising 2N control phasor signals; and
   amplitude modulating each of said 2N reference phasor signals with a distinct one of said 2N control phasor signals, and then combining said modulated reference phasor signals to generate an output clock signal having an output frequency of $f_0+f_M$.

2. A method of generating a clock signal, comprising:
   receiving an input signal having an associated input frequency;
   generating a 2N-phase reference clock signal with a reference frequency $f_0$ of at least 50 megahertz, where N is a positive, odd integer having a value of at least three; said reference clock signal comprising 2N reference phasor signals;
   generating a 2N-phase control signal having a frequency $|f_M|$, where $f_M$ corresponds to the difference between a predefined integer multiple of said input frequency and said reference frequency; said control signal comprising 2N control phasor signals; and
   amplitude modulating each of said 2N reference phasor signals with a distinct one of said 2N control phasor signals, and then combining said modulated reference phasor signals to generate an output clock signal having an output frequency of $f_0+f_M$.

3. The method of generating a clock signal set forth in claim 2, further including the steps of:
   continually comparing said output clock signal with said input frequency and adjusting said frequency $f_M$ so that said output frequency closely matches said predefined integer multiple of said input frequency.

4. The method of generating a clock signal set forth in claim 2,
   where said reference frequency differs from said predefined integer multiple of said input frequency by no more than a factor of one in a thousand.

5. A clock signal generator, comprising:
   a high frequency clock generator which generates a 2N-phase reference clock signal with a reference frequency $f_0$, where N is a positive, odd integer having a value of at least three; said reference clock signal comprising 2N reference phasor signals;
   a waveform generator which generates a 2N-phase control signal having a specified frequency $|f_M|$; said control signal comprising 2N control phasor signals; and
   a frequency correction circuit, coupled to said high frequency clock generator and said waveform generator, for generating an output clock signal having a output frequency equal to $f_0+f_M$; said frequency correction circuit including a modulation circuit which modulates each of said 2N reference phasor signals with a distinct one of said 2N control phasor signals and then combines the resulting modulated reference phasor signals to generate said output clock signal.

6. A clock signal generator, comprising:
   a high frequency clock generator which generates a 2N-phase reference clock signal with a reference frequency $f_0$ of at least 50 megahertz, where N is a positive, odd integer having a value of at least three; said reference clock signal comprising 2N reference phasor signals;
   a waveform generator which generates a 2N-phase control signal having a specified frequency $|f_M|$; said control signal comprising 2N control phasor signals; and
   a frequency correction circuit, coupled to said high frequency clock generator and said waveform generator, for generating an output clock signal having a output frequency equal to $f_0+f_M$; said frequency correction circuit including a modulation circuit which modulates each of said 2N reference phasor signals with a distinct one of said 2N control phasor signals and then combines the resulting modulated reference phasor signals to generate said output clock signal.

7. The clock signal generator of claim 6, further including:
   means for receiving an input signal having an associated input frequency; and
   phase detector means for continually comparing said output clock signal with said input signal and adjusting said frequency $f_M$ so that said output frequency closely matches a predefined integer multiple of said input frequency.

8. The clock signal generator set forth in claim 7,
   where said reference frequency differs from said predefined integer multiple of said input frequency by no more than a factor of one in a thousand.

9. A clock signal generator, comprising:
   a high frequency clock generator which generates an N-phase reference clock signal with a reference frequency $f_0$ of at least 50 megahertz, where N is a positive, odd integer having a value of at least three;
   a first set of inverters, coupled to said high frequency clock generator, for inverting each phase of said reference clock signal so as to generate 2N equally phase spaced reference phasor signals;
   a waveform generator which generates an N-phase control signal having a specified frequency $|f_M|$, where $f_M$ can have a positive or negative value;
   a second set of inverters, coupled to said waveform generator, for inverting each phase of said control signal so as to generate 2N equally phase spaced control phasor signals; and
   a frequency correction circuit, coupled to said first and second sets of inverters, for generating an output clock signal having a output frequency equal to $f_0+f_M$; said frequency correction circuit including a modulation circuit which modulates each of said 2N reference phasor signals with a distinct one of said 2N control phasor signals and then combines the resulting modulated reference phasor signals to generate said output clock signal.

10. The clock signal generator of claim 9, further including:

means for receiving an input signal having an associated input frequency; and phase detector means for continually comparing said output frequency with said input frequency and adjusting said frequency $f_M$ so that said output frequency closely matches a predefined integer multiple of said input frequency.

11. A clock signal generator, comprising:

a first clock generator which generates an N-phase reference clock signal with a frequency $f_0$, where N is a positive integer having a value of at least three; said reference clock signal having reference clock components C1, C2 to CN;

a second clock generator which generates an N-phase control signal having a specified frequency $f_M$, said control signal having sequentially ordered control signal components P1, P2 to PN which are equally phase spaced; said control signal components P1, P2 to PN having a leading/lagging phase relationship wherein each control signal component Pi leads/lags control component Pi+1;

modulation means for modulating each of said reference clock components with a distinct one of said control signal components; and summing means for combining each of said modulated reference clock components to generate a synthesized clock signal, said synthesized clock signal having frequency $f_0+f_M$ when said control signal components having a leading phase relationship, said synthesized clock signal having frequency $f_0-f_M$ when said control signal components having a lagging phase relationship.

* * * * *